United States Patent [19]

Buhr et al.

[11] 4,266,001
[45] May 5, 1981

[54] LIGHT-SENSITIVE MIXTURE

[75] Inventors: Gerhard Buhr, Königstein; Hans Ruckert, Wiesbaden, both of Fed. Rep. of Germany

[73] Assignee: Hoechst Aktiengesellschaft, Fed. Rep. of Germany

[21] Appl. No.: 51,908

[22] Filed: Jun. 25, 1979

[30] Foreign Application Priority Data

Jun. 26, 1978 [DE] Fed. Rep. of Germany ....... 2828037

[51] Int. Cl.³ .................. G03C 1/54; C07C 113/00
[52] U.S. Cl. .................................. 430/192; 430/165; 430/191; 430/193; 430/326; 260/141
[58] Field of Search ............... 430/192, 193, 191, 189, 430/190, 165, 326; 260/141 D, 141 R

[56] References Cited

U.S. PATENT DOCUMENTS

| 1,260,028 | 3/1961 | France | |
| 3,046,110 | 7/1962 | Schmidt | 430/193 |
| 3,046,118 | 7/1962 | Schmidt | 430/192 |
| 3,130,049 | 4/1964 | Neugebauer et al. | 430/192 |
| 3,188,210 | 6/1965 | Fritz et al. | 430/193 |
| 3,640,992 | 2/1972 | Sus et al. | 260/141 D |
| 3,669,658 | 6/1972 | Yonezawa et al. | 430/191 |
| 3,785,825 | 1/1974 | Deutsch et al. | 430/192 |
| 4,005,437 | 1/1977 | Ross et al. | 260/141 D |
| 4,157,918 | 6/1979 | Wanat et al. | 430/192 |

FOREIGN PATENT DOCUMENTS

| 160783 | 7/1974 | Czechoslovakia . |
| 160784 | 7/1974 | Czechoslovakia . |
| 872154 | 5/1952 | Fed. Rep. of Germany . |
| 2742631 | 9/1977 | Fed. Rep. of Germany . |

*Primary Examiner*—Charles L. Bowers, Jr.
*Attorney, Agent, or Firm*—James E. Bryan

[57] ABSTRACT

A positive-working light-sensitive mixture for the preparation of printing plates, in particular planographic printing plates, and photoresists is described, which comprises an alkali-soluble binder, preferably a novolak, and an o-naphthoquinone diazide of the formula

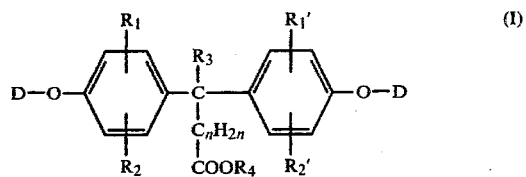

in which $R_1$, $R_1'$, $R_2$ and $R_2'$ are identical or different and represent hydrogen, chlorine or bromine atoms, alkyl, alkoxy or alkoxyalkyl groups having 1 to 6 carbon atoms or alkenyl groups having 2 to 6 carbon atoms, $R_3$ represents a hydrogen atom or an alkyl group having 1 to 4 carbon atoms, $R_4$ represents a hydrogen atom, an optionally substituted alkyl group, the carbon chain of which can be interrupted by ether oxygen atoms, an optionally substituted cycloalkyl group having 5 to 16 carbon atoms or an optionally substituted alkenyl group having 2 to 16 carbon atoms, n represents zero or an integer from 1 to 4 and D represents a 1,2-naphthoquinone-2-diazide-sulfonyl group. The new naphthoquinone diazides are distinguished by a high solubility in organic solvents and by good reprographic properties.

18 Claims, No Drawings

LIGHT-SENSITIVE MIXTURE

The invention relates to a positive-working light-sensitive mixture which contains a resinous binder, which is insoluble in water and soluble or swellable in aqueous-alkaline solutions, and a bis-1,2-naphthoquinone-2-diazide-sulfonic acid ester of a 4,4'-dihydroxy-diphenylmethane derivative.

A large number of derivatives, in particular esters, of 1,2-naphthoquinone-2-diazide-sulfonic acids are already known, which can be used as light-sensitive compounds in positive-working copying materials. The book by Jaromir Kosar: "Light-Sensitive Systems", John Wiley & Sons, New York, 1965, mentions on pages 343–351 a number of light-sensitive naphthoquinone diazides, and German Pat. Nos. 938,233; 1,118,606; and 1,120,273, and German Offenlegungsschrift No. 1,904,764, describe compounds of this type, which are particularly suitable for the preparation of positive-working printing plates. Among these compounds, those are preferred more recently, which do not have any free OH groups because they give longer printing runs and better resistance to developers. Moreover, to achieve long printing runs, compounds having more than one o-naphthoquinone diazide-sulfonic acid ester group in the molecule are preferred in most cases. These compounds include, for example, bis-(1,2-naphthoquinone-2-diazide-5-sulfonic acid) ester of 2,2-bis-(4-hydroxyphenyl)-propane which is described in German Pat. No. 872,154. Similar compounds are also described in the earlier German patent application No. P 27 42 631.9. In spite of the excellent copying properties and technological properties in printing, which are provided by these compounds in copying materials, a relatively low solubility in organic solvents, similar to other representatives of this group, stands in the way of their wider technical application. The preparation of more concentrated solutions, such as are required for machine-coating of aluminum web or for the preparation of copying lacquers, is more difficult.

This disadvantage already has been recognized and attempts to overcome it have been made in Czech Pat. Nos. 160,783 and 160,784 by using the mono-1,2-naphthoquinone-2-diazide-5-sulfonic acid ester of 2,2-bis-(4-hydroxyphenyl)-propane. In the condensation reaction of the bisphenol with 1,2-naphthoquinone-2-diazide-5-sulfonic acid chloride, however, the formation of the bis-sulfonic acid ester is unavoidable. Mixtures are obtained. Solutions of these mixtures in organic solvents can be subject to changes, as the result of less soluble constituents crystallizing out and thus interfering with the coating of printing plates and printed board assemblies. In addition, as mentioned, mono-1,2-naphthoquinone diazide-sulfonic acid esters frequently have an adverse effect on the length of the printing run of offset printing plates prepared with the use thereof and have the effect of an unsatisfactory resistance to developers.

It is the object of the invention to provide a light-sensitive positive-working mixture containing new 1,2-naphthoquinone-2-diazide-sulfonic acid esters as the light-sensitive compounds, which mixture is at least comparable in its technological properties in printing and copying with the best hitherto known mixtures of this type, but the light-sensitive compounds of which are additionally distinguished by a higher solubility in organic solvents and can be prepared in a simple manner in a chemically homogeneous form.

The starting point of the invention is a light-sensitive mixture which contains a resinous binder, which is insoluble in water and soluble or at least swellable in aqueous-alkaline solutions, and a bis-1,2-naphthoquinone-2-diazide sulfonic acid ester of a 4,4'-dihydroxy-diphenylmethane derivative.

The object is achieved by an ester corresponding to the formula I

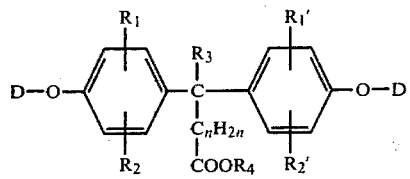

in which $R_1$, $R_1'$, $R_2$ and $R_2'$ are identical or different and represent hydrogen, chlorine or bromine atoms, alkyl, alkoxy or alkoxyalkyl groups having 1 to 6 carbon atoms or alkenyl groups having 2 to 6 carbon atoms, $R_3$ represents a hydrogen atom or an alkyl group having 1 to 4 carbon atoms, $R_4$ represents a hydrogen atom, an optionally substituted alkyl group, the carbon chain of which can be interrupted by ether oxygen atoms, an optionally substituted cycloalkyl group having 5 to 16 carbon atoms or an optionally substituted alkenyl group having 2 to 16 carbon atoms, n represents zero or an integer from 1 to 4 and D represents a 1,2-naphthoquinone-2-diazide-sulfonyl group.

The naphthoquinone-diazide compounds contained in the mixture according to the invention are new. They are prepared according to known processes by esterifying the corresponding bisphenol with reactive naphthoquinone diazide sulfonic acid derivatives, for example the acid chloride. Preferred processes which can be used are the reactions in inert solvents, such as ketones, esters or chlorinated hydrocarbons, in the presence of tertiary amines, such as pyridine, dimethylaniline or triethylamine. The naphthoquinone diazide sulfonic acid esters, however, also can be produced in organic-aqueous solutions, for example in mixtures of dioxane or acetone and aqueous sodium carbonate solution or sodium bicarbonate solution.

The bisphenol components, that is to say the bisphenol carboxylic acids and their esters, are obtainable by a condensation reaction of phenol or appropriately substituted phenols with oxocarboxylic acids or the esters thereof, as described, for example, in Journal of Organic Chemistry, 23, 1,004 (1958), in German Auslegeschrift No. 1,093,377, or in German Pat. No. 1,953,332. The catalysts used are acid agents, for example sulfuric acid or concentrated hydrochloric acid, by themselves or with co-catalysts, mixed with acetic acid, if appropriate. The esterification of the free carboxylic acids is carried out by known processes, normally with acid catalysis in an excess of the alcohol to be esterified or with azeotropic removal of the water of reaction in the presence of an entrainer, for example of benzene, toluene or methylene chloride.

The groups $R_1$, $R_1'$, $R_2$ and $R_2'$ in the benzene nuclei of the bisphenol are preferably hydrogen atoms or methyl groups. If these groups are substituents which differ from hydrogen, they are preferably in the 3-position or in the 3-position and 5-position of the 4-hydroxyphenyl groups. The group $R_3$ is preferably a methyl group, n preferably denotes a number from 1 to 3, the group $C_nH_{2n}$ being preferably unbranched. Compounds in which $R_3$ is a hydrogen atom and n is zero are also preferred. $R_4$ generally is a saturated straight-chain or branched alkyl group with 1 to 12 carbon atoms, the chain of which can be interrupted by ether oxygen atoms, and preferably such a group which contains up to four ether groups and 1 to 8 carbon atoms. The sulfonic acid group of the 1,2-naphthoquinone diazide derivatives is in general in the 4-position or 5-position of the naphthoquinone diazide, the 5-sulfonic acid esters being preferred. Preferred oxocarboxylic acids are glyoxylic acid, acetoacetic acid and levulinic acid, and preferred hydroxyaryl groups are 4-hydroxyphenyl, 4-hydroxy-3-methyl-phenyl and 4-hydroxy-3,5-dimethyl-phenyl groups.

In addition to the compounds mentioned in the examples, it is possible to employ, for example, the bis-1,2-naphthoquinone diazide-4- and in particular -5-sulfonic acid esters of the bisphenol derivatives which follow: the ethyl, butyl and ethoxyethyl esters of 2,2-bis-(4-hydroxy-3-methyl-phenyl)-acetic acid, the methyl and ethyl esters of 2,2-bis-(4-hydroxy-phenyl)-propionic acid, the methyl, ethyl, hexyl, 2-ethoxy-ethyl and 2-butoxy-ethyl esters of 3,3-bis-(4-hydroxy-phenyl)-butyric acid, the ethyl, isopropyl, 2-methoxy-ethyl, isobutyl and cyclohexyl esters of 3,3-bis-(4-hydroxy-3-methyl-phenyl)-butyric acid, the methyl, ethyl, dodecyl, benzyl and allyl esters of 3,3-bis-(4-hydroxy-3,5-dimethyl-phenyl)-butyric acid, 3,3-bis-(3-allyl-4-hydroxy-phenyl)-butyric acid ethyl ester, the methyl, ethyl, n-propyl, 2-ethoxyethyl, isobutyl and n-decyl esters of 4,4-bis-(4-hydroxy-phenyl)-butyric acid, the methyl, 3-methoxy-butyl, 2-ethyl-hexyl and octyl esters of 4,4-bis-(4-hydroxy-3-methyl-phenyl)-butyric acid, the 2-hydroxy-ethyl and 6-chloro-hexyl esters of 2,2-bis-(4-hydroxyphenyl)-valeric acid, the methyl and butyl esters of 4,4-bis-(4-hydroxy-2-methoxy-phenyl)-valeric acid, the methyl, ethyl and isooctyl esters of 4,4-bis-(4-hydroxy-3-methyl-phenyl)-valeric acid, the methyl, ethyl and 2-ethoxy-ethyl esters of 4,4-bis-(4-hydroxy-3,5-dimethyl-phenyl)-valeric acid, the methyl, ethyl and n-propyl esters of 4,4-bis-(3-chloro-4-hydroxy-phenyl)-valeric acid, the methyl and ethyl esters of 4,4-bis-(4-hydroxy-phenyl)-hexanoic acid, the ethyl and 2-methoxy-ethyl esters of 4,4-bis-(4-hydroxy-3-methyl-phenyl)-hexanoic acid, the methyl, ethyl and 2-ethoxyethyl esters of 5,5-bis-(4-hydroxy-phenyl)-hexanoic acid, the methyl, n-propyl and 2-(2-methoxyethoxy)-ethyl esters of 5,5-bis-(4-hydroxy-3-methylphenyl)-hexanoic acid, the methyl and ethyl esters of 6,6-bis-(4-hydroxy-3-methyl-phenyl)-heptanoic acid, the methyl and ethyl esters of 5,5-bis-(4-hydroxy-3,5-dimethyl-phenyl)-heptanoic acid, the methyl and ethyl esters of 4,4-bis-(4-hydroxy-phenyl)-octanoic acid and the methyl and ethyl esters of 6,6-bis-(4-hydroxy-3-methyl-phenyl)-octanoic acid.

Bisphenol carboxylic acid derivatives having bulkier substituents in the 3-position of the hydroxyaryl radical also can be reacted with naphthoquinone diazide sulfonic acid chloride, albeit in a slower reaction and with poorer yield, as could be shown for the example of the bis-1,2-naphthoquinone diazide-5-sulfonic acid ester of 3,3-bis-(3-tert.-butyl-4-hydroxy-phenyl)-butyric acid methyl ester.

The concentration of the new naphthoquinone diazide sulfonic acid esters in the light-sensitive layer can vary within relatively wide limits. In general, the proportion is 3 to 50%, preferably between 7 and 35%, relative to the weight of the solids fraction in the light-sensitive mixture. If appropriate, a part of the new naphthoquinone diazide derivatives also can be replaced, within the limits of these quantities, by a corresponding quantity of a known naphthoquinone diazide, but the quantitative proportion of the new compound preferably should predominate.

The light-sensitive mixtures according to the invention further contain a polymeric, water-insoluble resinous binder which dissolves in the solvents used for the mixture according to the invention and is also suitable, or at least swellable, in aqueous alkalies.

The novolak condensation resins, proven in many positive-copying materials based on naphthoquinone diazides, also have proved to be particularly useful and advantageous as an addition to the mixtures, according to the invention, with the new naphthoquinone diazide sulfonic acid esters. A clear differentiation between the exposed and unexposed parts of the layer on development is promoted, in particular by the more highly condensed resins with substituted phenols, for example cresols, as partners for the condensation reaction with formaldehyde. The nature and amount of the novolak resins can differ depending upon the intended use; novolak proportions in total solids between 95 and 50, particularly preferably 90–65, percent by weight are preferred. Additionally, numerous other resins also can be included, preferably vinyl polymers, such as polyvinyl acetates, polyacrylates, polyvinyl ethers, polyvinyl pyrrolidones and copolymers of the monomers on which these are based. The most favorable proportion of these resins depends upon the technological requirements and on the influence on the developing conditions and, in general, it does not exceed 20% by weight of the alkali-soluble resin. For special requirements, such as flexibility, adhesion, gloss, coloration, color change and the like, the light-sensitive mixture can in addition also contain small amounts of substances, such as polyglycols, cellulose derivatives, such as ethyl cellulose, wetting agents, dyestuffs, adhesion-promoters and finely particulate pigments as well as UV absorbers, if required. Further binders which are alkali-soluble or swellable in alkali are naturally occurring resins, such as shellac and colophony, and synthetic resins, such as, for example, copolymers of styrene and maleic anhydride or copolymers of acrylic acid or methacrylic acid, in particular with acrylic or methacrylic acid esters.

For coating a suitable layer support, the mixtures are in general dissolved in a solvent. The selection of the solvents is to be matched to the envisaged coating process, the layer thickness and the drying conditions. Suitable solvents for the mixture according to the invention are ketones, such as methyl ethyl ketone, chlorinated hydrocarbons, such as trichloroethylene and 1,1,1-trichloroethane, alcohols, such as n-propanol, ethers, such as tetrahydrofuran, alcohol-ethers, such as ethylene glycol monoethyl ether, and esters, such as butyl acetate. Mixtures also can be used and, for special purposes, these can also additionally contain solvents, such as acetonitrile, dioxane or dimethyl formamide. In principle, any solvents can be used which do not irreversibly react with the components of the layer.

The layer supports used for layer thicknesses below about 10 μm are in most cases metals. The following can be employed for offset printing plates: bright-rolled, mechanically or electrochemically roughened and, if appropriate, anodized aluminum which also can have been chemically pretreated, for example with polyvinyl phosphonic acid, silicates or phosphates, and in addition multi-metal plates with Cu/Cr or brass/Cr as the top layer. For the preparation of letterpress printing plates, the mixtures according to the invention can be applied to zinc or magnesium plates and to commercially available micro-crystalline alloys thereof for single-stage etching processes, and also to etchable plastics, such as polyoxymethylene. Due to their good adhesion and etching resistance on copper surfaces and nickel surfaces, the mixtures according to the invention are suitable for gravure printing forms or silk screen printing forms. Also, the mixtures according to the invention can be used as photoresists in the manufacture of printed board assemblies and in chemical milling.

Other supports, such as wood, paper, ceramics, textiles and other metals, also can be used for further applications.

Preferred supports for thick layers of over 10 μm are plastic films which then serve as temporary supports for transfer layers. For this purpose and for color proofing films, polyester films, for example of polyethylene terephthalate, are preferred. However, polyolefin films, such as polypropylene, are also suitable.

Coating on the support material is carried out in a known manner by whirler-coating, spraying, dipping, rolling by means of sheet dies, doctor blades or by caster application. Finally, coating of, for example, printed board assemblies, glass or ceramics and silicon discs also can be effected by layer transfer from a temporary support.

The light sources customary in industry are used for exposure. It is also possible to provide an image by irradiation with electrons.

The aqueous-alkaline solutions of graded alkalinity, which are used for developing and which also can contain minor amounts of organic solvents or wetting agents, remove the areas, which the light has struck, from the copying layer and thus produce a positive image of the original.

A preferred application of the light-sensitive mixtures according to the invention is in the preparation of printing forms, that is to say in particular forms for offset printing, halftone gravure printing and silk screen printing, in copying lacquers and so-called dry resists.

The printing plates prepared with the use of the new compounds possess a high light-sensitivity for practical purposes and an improved resistance to alkaline developers. The preferred compounds themselves are distinguished by good to excellent solubility in the customary organic solvents and by good compatibility with the constituents of the copying layer.

For a further increase in the stability on printing and the resistance to wash-out solutions, correcting agents and printing inks which can be cured by UV light, the developed plates can be heated briefly to elevated temperatures, as is known from British Pat. No. 1,154,749.

In the following text, examples of the mixture according to the invention are given. In these, the preparation of a number of new bis-(1,2-naphthoquinone-2-diazide-sulfonic acid esters) of bisphenol carboxylic acids and bisphenol carboxylic acid esters, which were tested as the light-sensitive components in mixtures according to the invention, is described first. The numbering of the new compounds from 1 to 22 is retained in the application examples. Unless otherwise stated, relative percentages and quantities are to be understood as being in units by weight.

General instructions for the preparation of the compounds 1 to 22 listed in Table 1

1.05 moles of triethylamine are added to 0.5 mole of bisphenol carboxylic acid ester and 1.0–1.03 moles of 1,2-naphthoquinone-2-diazide sulfonic acid chloride in 1.5 l of acetone in the course of 20 minutes while stirring, the temperature being kept below 25° C. by cooling. After the dropwise addition has ended, stirring is continued for a further 1.5 hours, and (a) if the naphthoquinone diazide sulfonic acid ester has already precipitated, the latter is filtered off by suction, if necessary after diluting the reaction batch with water, is washed with cold acetone and then with water and the filter residue is dried under reduced pressure or in a circulating air drying cabinet at a moderately elevated temperature. In general, this gives virtually pure bissulfonic acid esters as shown by thin layer chromatography (silica gel, developing solvent: cyclohexane/ethyl acetate mixtures). If necessary, the products can be recrystallized from solvents, such as acetone, methyl ethyl ketone, ethyl acetate or ethylene glycol monomethyl ether.

(b) In the case of bis-naphthoquinone diazide sulfonic acid esters which are completely soluble in the reaction mixture, the batch is freed from precipitated triethylammonium chloride by filtration with suction. Up to 90% of the base employed thus can be recovered. The filtrate is stirred into a ten-fold amount of 4% concentration aqueous hydrochloric acid, and the precipitated bis-sulfonic acid ester is filtered off, washed with water until free from acid and dried as under (a).

In the case of compounds 1 and 12, at least 1.5 moles of 1,2-naphthoquinone-2-diazide-5-sulfonic acid chloride and correspondingly more base must be used for complete reaction to give the bis-ester, and the analytically pure compound 16 was obtained by preparative thin layer chromatography of the crude product.

The bromine substituents in compound 11 are introduced into the bisphenol carboxylic acid ester in known manner. Advantageously, the starting compound is dissolved in glacial acetic acid and the calculated amount of bromine is added dropwise to the solution at room temperature with stirring and, if necessary with cooling.

TABLE 1

Bis-1,2-naphthoquinone-2-diazide sulfonic acid esters of the formula II $$DO-\underset{R_2}{\overset{R_1}{\bigcirc}}-\underset{\underset{CO_2R_4}{|}}{\overset{R_3}{\underset{|}{C}}}-\underset{R_2'}{\overset{R_1'}{\bigcirc}}-OD \quad (II)$$

$R_1 = R_1'$;
$R_2 = R_2'$

| No. | n | $R_1$ | $R_2$ | $R_3$ | $R_4$ | D | $N_{calc.}$ | $N_{found}$ |
|---|---|---|---|---|---|---|---|---|
| 1 | 2 | H | H | $CH_3$ | H | (1) | 7.46 | 7.4 |
| 2 | 2 | H | H | $CH_3$ | $CH_3$ | (1) | 7.33 | 7.2 |
| 3 | 2 | H | H | $CH_3$ | $C_2H_5$ | (1) | 7.19 | 7.0 |
| 4 | 2 | H | H | $CH_3$ | $C_2H_5$ | (2) | 7.19 | 6.9 |
| 5 | 2 | H | H | $CH_3$ | $i$-$C_3H_7$ | (1) | 7.07 | 7.2 |
| 6 | 2 | H | H | $CH_3$ | $n$-$C_4H_9$ | (1) | 6.94 | 6.8 |
| 7 | 2 | H | H | $CH_3$ | $CH_3OCH_2CH_2$ | (1) | 6.93 | 7.0 |
| 8 | 2 | H | H | $CH_3$ | $C_2H_5OCH_2CH$ | (1) | 6.81 | 6.7 |
| 9 | 2 | H | H | $CH_3$ | $CH_3CH(OCH_3)CH_2CH_2$ | (1) | 6.69 | 6.9 |
| 10 | 2 | H | H | $CH_3$ | $CH_3(CH_2)_{11}$ | (1) | 6.10 | 6.1 |
| 11 | 2 | Br | Br | $CH_3$ | $CH_3$ | (1) | 5.19 | 5.7 |
| 12 | 1 | $CH_3$ | H | $CH_3$ | H | (1) | 7.33 | 6.8 |
| 13 | 1 | $CH_3$ | H | $CH_3$ | $CH_3$ | (1) | 7.19 | 7.1 |
| 14 | 1 | $CH_3$ | H | $CH_3$ | $CH_3(OCH_2CH_2)_3$ | (1) | 6.15 | 6.1 |
| 15 | 1 | $CH_3$ | H | $CH_3$ | $CH_3(CH_2)_9$ | (1) | 6.19 | 6.1 |
| 16 | 1 | $t$-$C_4H_9$ | H | $CH_3$ | $CH_3$ | (1) | 6.49 | 6.0 |
| 17 | 0 | H | H | H | $CH_3$ | (1) | 7.75 | 7.4 |
| 18 | 0 | H | H | H | $C_2H_5$ | (1) | 7.60 | 7.3 |
| 19 | 0 | H | H | H | $n$-$C_3H_7$ | (1) | 7.46 | 7.4 |
| 20 | 0 | H | H | H | $n$-$C_4H_9$ | (1) | 7.33 | 7.3 |
| 21 | 0 | H | H | H | $CH_3OCH_2CH_2$ | (1) | 7.30 | 7.2 |
| 22 | 0 | H | H | H | $C_2H_5OCH_2CH_2$ | (1) | 7.18 | 7.1 |

(1) 1,2-Naphthoquinone-2-diazide-5-sulfonyl
(2) 1,2-Naphthoquinone-2-diazide-4-sulfonyl The solubility of the new naphthoquinone diazides, as compared with the known bis-1,2-naphthoquinone-2-diazide-5-sulfonic acid ester of 2,2-bis-(4-hydroxyphenyl)-propane (comparison compound V), was determined as follows: 2 g of the naphthoquinone diazide were suspended in each case in 50 g of ethylene glycol monomethyl ether and stirred for 2 hours at 26° C. Then, the mixture was filtered by suction, the filter residue was washed successively with 10 cm³ of methanol and 10 cm³ of ether and dried in vacuo and its weight was determined. The solubilities in ethylene glycol monomethyl ether, listed in Table 2, were calculated from the difference to the quantity employed:

| Solubility of various napthoquinone diazides | |
|---|---|
| Compound No. | Solubility (%) |
| 2 | 1.85 |
| 3 | 0.86 |
| 7 | 0.91 |
| 8 | 3.80 |
| 9 | 1.54 |
| 19 | 0.95 |
| 20 | >7.4 |
| 22 | 6.0 |
| V | 0.75 |

The table shows that the solubility of compound V is considerably exceeded by the new compounds. Due to their very good solubility, the compounds 2, 8, 9, 20 and 22 are here particularly preferred. In all cases, it was confirmed by diffraction diagrams taken with an X-ray diffractometer that the samples tested were substantially free from amorphous fractions. In every case, the solubility of a solid compound which is wholly or partially present in the amorphous state is markedly higher than that of the corresponding crystalline compound. A comparison with these values is, however, unreliable because the solubilities of amorphous compounds cannot be determined with exact reproducibility due to the differing tendency of supersaturated solutions to crystallize.

EXAMPLE 1

An electrolytically roughened and anodized aluminum foil is whirler-coated with a coating solution composed of 6.3 parts of weight of cresol-formaldehyde novolak (melting range 105°–120° C. according to DIN 53,181), 1.2 parts by weight of compound 3,
0.07 part by weight of crystal violet base,
0.17 part by weight of 1,2-naphthoquinone-2-diazide-4-sulfochloride,
0.25 part by weight of maleate resin (melting range 135°–145° C., acid number 15–25) and
92.01 parts by weight of a solvent mixture of tetrahydrofuran, ethylene glycol monomethyl ether and butyl acetate in a ratio of 2:2:1 by weight so that a layer weight of 2.0 g/m² is obtained after drying. The coated printing plate is exposed through a diapositive for 50 seconds under a 5 kW metal halide lamp at a distance of 110 cm and developed with a developer of the following composition:

5.5 parts by weight of sodium metasilicate×9 $H_2O$,
3.4 parts by weight of trisodium phosphate×12 $H_2O$,
0.4 part by weight of sodium hydrogen phosphate, anhydrous, and
90.7 parts by weight of water, the exposed layer areas being removed. A printing test with an offset printing form prepared in this way is stopped after 130,000 prints of still perfect quality. A similar result is obtained when the compound 3 in the above recipe is replaced by equal amounts of the compounds 4, 5, 6, 7, 8, 11, 19, 20, 21 or 22.

EXAMPLE 2

The new naphthoquinone diazides having a free carboxyl group are very suitable for the preparation of screen-free planographic printing plates. For this purpose, a mechanically roughened aluminum foil is coated with a solution of:

- 13.6 parts by weight of compound 1,
- 68.0 parts by weight of novolak according to Example 1,
- 17.0 parts by weight of a vinyl acetate/crotonic acid copolymer (95:5) of molecular weight 100,000, and
- 1.4 parts by weight of Sudanblau II (C.I. Solvent Blue 35)

in 1,000 parts by weight of a mixture of ethylene glycol monoethyl ether and butyl acetate in a ratio of 8:2. After drying, the layer is exposed for 90 seconds, using the apparatus described in Example 1, under a positive continuous tone original which has 13 equal density steps from 0.15 to 1.95, and is developed in one minute using the developer of Example 1. A print image for screen-free offset printing, having very soft transitions of tonal values and 11 wedge steps, is obtained. The compound 1 in the above recipe can be replaced by the same amount of compound 12 with a similar result.

EXAMPLE 3

Color proofing films for multi-color offset copying are prepared by coating a polyester film of 100 μm thickness with a solution of:

- 27.1 parts by weight of novolak according to Example 1,
- 6.8 parts by weight of vinyl acetate/crotonic acid copolymer according to Example 2,
- 18.6 parts by weight of compound 9 or 15,
- 13.6 parts by weight of polyethyl acrylate solution (40% in toluene, Plexisol B 574, Messrs. Röhm),
- 23.7 parts by weight of low-viscosity polyvinyl ethyl ether and
- 10.2 parts by weight of the yellow dyestuff Auramin O (C.I. 41,000)

in ethylene glycol monoethyl ether so that the layer thickness after drying is 1 μm. For the corresponding blue or red color films, equal amounts of the dyestuffs Viktoriareinblau FGA (C.I. Basic Blue 81) or Grasolechtrubin 2 BL (C.I. Solvent Red 128) respectively are used in place of the yellow dyestuff.

After exposure under positive originals, that is to say under the corresponding color separations for color process work, and after developing in the developer, diluted 1:1 with water, from Example 1, colored copies of the originals used are obtained.

EXAMPLE 4

To prepare a positive dry resist:

- 11.15 parts by weight of novolak according to Example 1,
- 2.79 parts by weight of vinyl acetate/crotonic acid copolymer according to Example 2,
- 4.18 parts by weight of a copolymer from 5:1:2 parts of n-hexyl methacrylate/methyl methacrylate/methacrylic acid, having an acid number of 158,
- 1.86 parts by weight of polyethylene glycol of molecular weight 2,000,
- 2.79 parts by weight of epoxide resin having an epoxy equivalent weight of 190,
- 2.32 parts by weight of compound 9,
- 0.45 part by weight of 1,2-naphthoquinone-2-diazide-4-sulfochloride, and
- 0.06 part by weight of crystal violet are dissolved in
- 46.50 parts by weight of ethylene glycol monoethyl ether and
- 27.90 parts by weight of methyl ethyl ketone.

An about 25 μm thick polyester film pretreated with an aqueous solution of 10% of trichloroacetic acid, 1% of polyvinyl alcohol and 0.1% of wetting agent, is coated with the above solution and dried. A cover film of polyethylene is then applied to the about 20 μm thick resist layer for protection against dust and scratches.

For the preparation of printed board assemblies, the positive dry resist film, after the cover film has been peeled off, is laminated in a commercially available laminator onto a cleaned, about 35 μm thick copper foil which is laminated onto a support of insulating material. After peeling off the support film, redrying if necessary, about 3 minutes' exposure in the apparatus described in Example 1 and about 2 minutes of spray-development with a developer of the following composition:

- 0.6 part by weight of NaOH,
- 0.5 part by weight of $Na_2SiO_3 \times 5\ H_2O$,
- 1.0 part by weight of n-butanol and
- 97.9 parts by weight of water, an excellent imagewise resist layer is obtained. It resists not only the conditions of etching processes, for example with $FeCl_3$, but is also galvano-resistant in the production of through-hole circuits, in particular in the successive build-up of copper, nickel and gold by electroplating.

EXAMPLE 5

A solution of:

- 3.0 parts by weight of compound 2 or 8,
- 21.0 parts by weight of phenol/formaldehyde novolak having a melting range of 110°–120° C. (according to the capillary method of DIN 53,181),
- 3.0 parts by weight of vinyl acetate/crotonic acid copolymer according to Example 2,
- 3.0 parts by weight of epoxide resin (epoxy equivalent weight of about 450), and
- 0.4 part by weight of the dyestuff Sudanblau II (C.I. Solvent Blue 35)

in

- 49.6 parts by weight of ethylene glycol monoethyl ether-acetate,
- 10.0 parts by weight of ethylene glycol monoethyl ether, and
- 10.0 parts by weight of butyl acetate gives a positive copying lacquer which is suitable for the production of printed board assemblies and of copper gravure cylinders, for use in chemical milling or for nickel electrotype stencils.

EXAMPLE 6

A copying layer of the following composition

- 86.6 parts by weight of cresol/formaldehyde novolak according to Example 1,
- 12.8 parts by weight of compound 13,
- 2.6 parts by weight of 1,2-naphthoquinone-2-diazide-4-sulfochloride and

What is claimed is:

1. A light-sensitive mixture, containing a resinous binder, which is insoluble in water and soluble or swellable in aqueous-alkaline solutions, and a light-sensitive bis-1,2-naphthoquinone-2-diazide-sulfonic acid ester of a 4,4'-dihydroxy-diphenylmethane derivative corresponding to the formula I

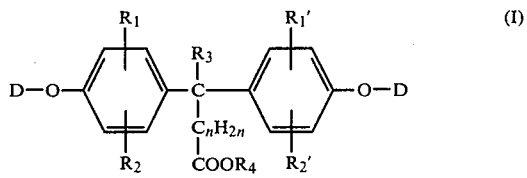

in which $R_1$, $R_1'$, $R_2$ and $R_2'$ are identical or different and represent hydrogen, chlorine or bromine atoms, alkyl, alkoxy or alkoxyalkyl groups having 1 to 6 carbon atoms or alkenyl groups having 2 to 6 carbon atoms, $R_3$ represents a hydrogen atom or an alkyl group having 1 to 4 carbon atoms, $R_4$ represents a hydrogen atom, a substituted or unsubstituted alkyl group, the carbon chain of which can be interrupted by ether oxygen atoms, a substituted or unsubstituted cycloalkyl group having 5 to 16 carbon atoms or a substituted or unsubstituted alkenyl group having 2 to 16 carbon atoms, n represents zero or an integer from 1 to 4 and D represents a 1,2-naphthoquinone-2-diazide-sulfonyl group.

2. A light-sensitive mixture as claimed in claim 1 in which in formula I, D is a 1,2-naphthoquinone-2-diazide-5-sulfonyl group.

3. A light-sensitive mixture as claimed in claim 1 in which a phenolic resin is the binder.

4. A light-sensitive mixture as claimed in claim 1 which comprises 7 to 35% by weight of an ester of formula I, relative to its non-volatile constituents.

5. A light-sensitive mixture as claimed in claim 1 in which in formula I, $R_4$ represents an ethoxyethoxy group.

6. A light-sensitive mixture as claimed in claim 2 in which in formula I, $R_1$, $R_1'$, $R_2$ and $R_2'$ represent hydrogen atoms, $R_3$ represents a methyl group, n represents the number 2, and $R_4$ represents an ethoxyethoxy group.

7. A light-sensitive mixture as claimed in claim 2 in which in formula I, $R_1$, $R_1'$, $R_2$, $R_2'$ and $R_3$ represent hydrogen atoms, n represents the number zero and $R_4$ represents an ethoxyethoxy group.

8. A light-sensitive mixture as claimed in claim 2 in which in formula I, $R_1$, $R_1'$, $R_2$, $R_2'$, and $R_3$ represent hydrogen atoms, n represents the number zero and $R_4$ represents an n-butyl group.

9. A light-sensitive compound having the formula

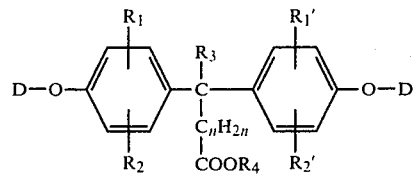

in which $R_1$, $R_1'$, $R_2$, and $R_2'$ are identical or different and represent hydrogen, chlorine or bromine atoms, alkyl, alkoxy or alkoxyalkyl groups having 1 to 6 carbon atoms or alkenyl groups having 2 to 6 carbon atoms, $R_3$ represents a hydrogen atom or an alkyl group having 1 to 4 carbon atoms, $R_4$ represents a hydrogen atom, a substituted or unsubstituted alkyl group, the carbon chain of which can be interrupted by ether oxygen atoms, a substituted or unsubstituted cycloalkyl group having 5 to 16 carbon atoms or a substituted or unsubstituted alkenyl group having 2 to 16 carbon atoms, n represents zero or an integer from 1 to 4 and D represents a 1,2-naphthoquinone-2-diazide-sulfonyl group.

10. A compound according to claim 9 in which D is a 1,2-naphthoquinone-2-diazide-5-sulfonyl group.

11. A compound according to claim 9 in which $R_4$ represents an ethoxyethoxy group.

12. A compound according to claim 9 in which $R_1$, $R_1'$, $R_2$ and $R_2'$ represent hydrogen atoms, $R_3$ represents a methyl group, n represents the number 2 and $R_4$ represents an ethoxyethoxy group.

13. A compound according to claim 9 in which $R_1$, $R_1'$, $R_2$, $R_2'$ and $R_3$ represent hydrogen atoms, n represents the number zero and $R_4$ represents an ethoxyethoxy group.

14. A compound according to claim 9 in which $R_1$, $R_1'$, $R_2$, $R_2'$, and $R_3$ represent hydrogen atoms, n represents the number zero and $R_4$ represents an n-butyl group.

15. A light-sensitive mixture as claimed in claim 1 in which in formula I, $R_1$, $R_1'$, $R_2$, and $R_2'$ represent hydrogen atoms or methyl groups which are in the 3-position or 3,5-position of the 4-(quinonediazidesulfonyloxy)-phenyl groups, $R_3$ represents a methyl group, and n represents an integer from 1 to 3.

16. A light-sensitive mixture as claimed in claim 1 in which in formula I $R_1$, $R_1'$, $R_2$ and $R_2'$ represent hydrogen atoms or methyl groups which are in the 3-position or 3,5-position of the 4-(quinonediazide sulfonyloxy)-phenyl groups, $R_3$ represents a hydrogen atom, and n represents 0.

17. A compound according to claim 9 in which $R_1$, $R_1'$, $R_2$ and $R_2'$ represent hydrogen atoms or methyl groups which are in the 3-position or 3,5-position of the 4-(quinonediazide sulfonyloxy)-phenyl groups, $R_3$ represents a methyl group, and n represents an integer from 1 to 3.

18. A compound according to claim 9 in which $R_1$, $R_1'$, $R_2$ and $R_2'$ represent hydrogen atoms or methyl groups which are in the 3-position or 3,5-position of the 4-(quinonediazide sulfonyloxy)-phenyl groups, $R_3$ represents a hydrogen atom, and n represents the number 0.

* * * * *